United States Patent [19]
Ohta

[11] Patent Number: 4,974,544
[45] Date of Patent: Dec. 4, 1990

[54] VAPOR DEPOSITION APPARATUS
[75] Inventor: Wasaburo Ohta, Yokohama, Japan
[73] Assignee: Ricoh Company, Co., Tokyo, Japan
[21] Appl. No.: 474,402
[22] Filed: Feb. 2, 1990

Related U.S. Application Data

[63] Continuation-in-part of Ser. No. 102,857, Sep. 30, 1987, abandoned.

[30] Foreign Application Priority Data

Oct. 7, 1986 [JP] Japan ................................ 61-238435
Jul. 14, 1987 [JP] Japan ................................ 62-175656

[51] Int. Cl.$^5$ ............................................. C23C 16/50
[52] U.S. Cl. ................................. 118/723; 204/192.31; 204/298
[58] Field of Search ................... 118/723; 204/192.31, 204/298; 427/38, 39

[56] References Cited
FOREIGN PATENT DOCUMENTS 50-84472  2/1975  Japan .
50-84474  9/1975  Japan .
52-78777  7/1977  Japan .
59-89763  5/1984  Japan .................................. 427/38
59-157279 9/1984  Japan .

OTHER PUBLICATIONS

Bunshah, Deposition Technologies for Films and Coatings, Noyes Publications, Park Ridge, N.J., U.S.A. ©1982, p. 258.

Primary Examiner—Richard Bueker
Attorney, Agent, or Firm—Oblon, Spivak, McClelland, Maier & Neustadt

[57] ABSTRACT

A vapor deposition apparatus includes a vacuum chamber into which an active gas, an inert gas or a mixture of the active gas and the inert gas, a reactor for converting a gaseous raw material into a gaseous thin-film forming substance, and a nozzle attached to the reactor so as to blow out the gaseous thin-film forming substance toward a substrate supported by a counter electrode. The nozzle is so adapted as to bring about a pressure difference between an interior space of the reactor and the vacuum chamber, which pressure difference causes the blown-out gaseous thin-film forming substance to be formed a cluster. The vapor deposition apparatus makes it possible to deposit a thin-film on a substrate having poor thermal stability and to form highly dense thin-film.

5 Claims, 1 Drawing Sheet

VAPOR DEPOSITION APPARATUS

CROSS-REFERENCE TO RELATED APPLICATION

The present application is a continuation-in-part of application Ser. No. 102,857 field on Sept. 30, 1987, now abandoned.

BACKGROUND OF THE INVENTION

1. Field of the Invention

The present invention relates to a vapor deposition apparatus, and more particularly to a vapor deposition apparatus in which a thin film having strong adhesiveness to a substrate is formed and which is particularly applicable to a substrate material having poor thermal resistance, such as organic plastics.

2. Description of the Related Art

Conventionally, as a typical PVD (physical vapor deposition) process forming a thin film, a so-called ion plating process is known to the art, which includes generating a high-frequency electromagnetic field between the vapor exit means and an object to be vapor-deposited (substrate) to ionize the evaporated material in an active or inert gas to perform vacuum vapor deposition. Also, a DC ion plating process which applies a direct current voltage between a vapor exit means and a substrate is proposed in Japanese Patent Publications No. 29971/1977 and 29091/1977, etc. According to these methods, the substrate surface is cleaned and activated by ion impact and the adhesion of the resulted film is high. However, these methods have the drawback that, in order to attain required level of ionization, a substantial quantity of active or inert gas must be present in a vacuum chamber, so that the quality of the resulting film is not very good.

In contrast with the above methods, a CVD (chemical vapor deposition) process, wherein a chemical reaction takes place, gives a filmwise deposit using a rather simple installation as compared to the PVD process. However, the substrate must be heated to a rather high temperature, so that this method cannot be applied to a substrate having poor thermal resistance, such as organic plastics.

SUMMARY OF THE INVENTION

An object of the present invention is to provide the vapor deposition apparatus which makes it possible to deposit a thin-film on a substrate having poor thermal stability and to form highly dense thin-film.

According to the present invention, the aforementioned object is attained by a vapor deposition apparatus comprising: a vacuum chamber for receiving an active gas, an inert gas or a mixture of the active gas and the inert gas; a reactor disposed within the vacuum chamber for receiving a gaseous raw material; a heating unit attached to the reactor for heating the received gaseous raw material up to a temperature of producing a gaseous thin-film forming material; a nozzle attached to an upper end of the reactor, and having a cross sectional area smaller than that of an interior space of the reactor for blowing out the produced gaseous thin-film forming material into the vacuum chamber, the cross sectional area of the nozzle being determined in such a manner as to bring about a pressure difference between the interior space and the vacuum chamber, which pressure difference makes the blown-out gaseous thin-film forming substance a state of cluster; a counter electrode situated in the vacuum chamber, holding a substrate oppositely to the reactor, and maintained at an electric potential equal or negative to that of the reactor and the nozzle; a grid in the form of a net placed between the reactor and the counter electrode, and having openings large enough to pass the gaseous thin-film forming substance; an electric source unit electrically connected to both the counter electrode and the reactor for maintaining the grid at an electric potential positive to those of both the counter electrode and the reactor; and a filament placed in the vacuum chamber at a position between the reactor and the grid for emitting thermoelectrons necessary to ionize the gaseous thin-film forming substance and the active gas, the inert gas or the mixture.

According to the present invention, as just described herein, a filament is disposed between the reactor and the grid to generate thermoelectrons, which contribute effectively to the ionization of a gas and a gaseous thin-film forming substance within the vacuum chamber. Thus, the ionization of the gaseous thin-film forming substance becomes possible even under high vacuum up to $10^{-4}$ Torr.

The gaseous thin-film forming substance introduced into the vacuum chamber is in the state of cluster, which is effective to form a dense thin-film on the substrate. Therefore, the structure of a thin film formed is very dense. Usually, it is said that the density of a thin film is lower than that of a bulk. In contrast, according to the present invention, a thin film very close in density to bulk is obtained. The formation of a film under such high vacuum serves to reduce the number of gaseous molecules occluded in the thin film to thereby provide a thin film of high purity.

According to the present invention, since the gaseous thin-film forming substance is formed at a relatively low temperature in the gas introducing device and then ionized in the vacuum chamber to have a high energy, thin-film formation is realized though the substrate is maintained at a low temperature.

If an appropriate crystalline substrate is employed, an epitaxial growth of the deposited substance may also be possible. In other words, a vapor deposition apparatus according to the present invention is very suitable for the production of thin semiconductor films constituting IC's and LSI's, as well as of thin metallic films of high purity which is useful as the electrodes therefor.

Further objects and advantages of the present invention will be apparent from the following description of the preferred embodiment of the invention as illustrated in the accompanying drawings.

DETAILED DESCRIPTION OF THE INVENTION

Figure 1:
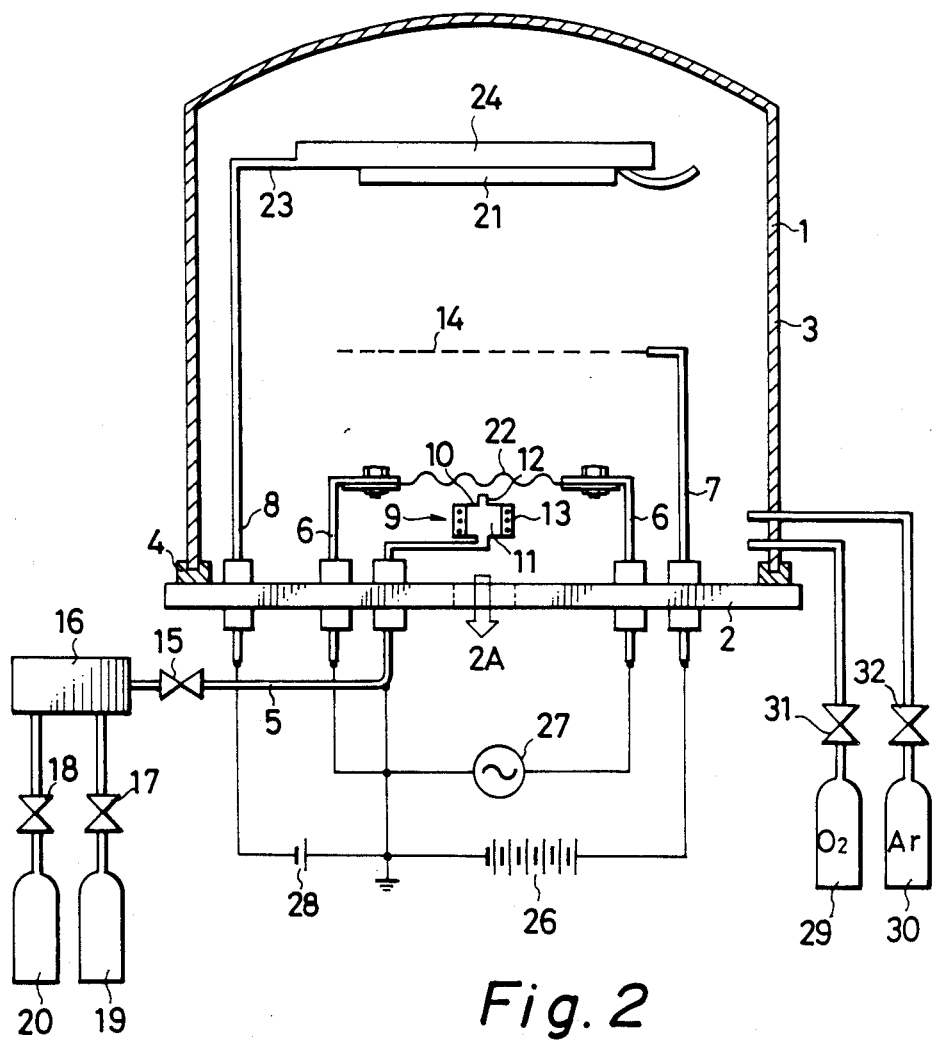
FIG. 1 is a schematic cross-sectional view showing an embodiment of the vapor deposition apparatus in accordance with the present invention.

In view of the drawbacks of the prior art technologies, the present invention aims to combine the advantages of the above PVD and CVD processes at the same time. Thus, the object of the present invention is to provide a vapor deposition apparatus which forms a thin film having strong adhesiveness to a substrate and high density and is applicable eve to a substrate having poor thermal resistance, such as organic plastics.

A vapor deposition apparatus according to the present invention mainly includes a vacuum chamber, a gas introducing device in which a gaseous raw material is heated to change the gaseous raw material into a gaseous thin-film forming substance, and from which the gaseous thin-film forming substance is supplied into the vacuum chamber, a counter electrode, a grid and a filament that emits thermoelectrons.

In the vacuum chamber, there is disposed the gas introducing device which is coupled at one end thereof to a bomb containing a raw material, and which is provided at the other end thereof with a nozzle opening into the vacuum chamber. The gas introducing device is further provided with heating means for heating the gaseous raw material supplied into the gas introducing device to produce a gaseous thin-film forming substance to be supplied into the vacuum chamber through the nozzle. The produced gaseous thin-film forming substance is blown out from the nozzle by a differential pressure between a pressure in the gas introducing device and a pressure in the vacuum chamber, whereby the gaseous thin-film forming substance is supplied in the state of cluster into the vacuum chamber.

An active or inert gas or a mixture of the two is introduced into the vacuum chamber. A counter electrode disposed within the chamber holds a substrate opposite to the gas introducing device and has the same electric potential as, or a positive potential relative to, that of the gas introducing device.

A grid, which allows the gaseous thin-film forming substance to pass therethrough, is interposed between the gas introducing device and the counter electrode. It is maintained at a positive electric potential as compared to that of both the counter electrode and the filament. Accordingly, two oppositely directed electric fields are formed within the vacuum chamber: from the grid to the substrate and from the grid to the gas introducing device A filament to provide thermoelectrons is disposed within the vacuum chamber on the side of the gas introducing device from the grid. Thermoelectrons produced with this filament are useful to ionize a substantial part of the gaseous thin-film forming substance into positive ions. As the thus partially ionized gaseous thin-film forming substance passes through the grid, the gaseous thin-film forming substance are further ionized by an ionized inert gas or ionized active gas and accelerated toward the substrate by the action of the electric fields (Coulomb force).

Since the thermoelectrons are emitted from the filament with a level of kinetic energy corresponding to the temperature of the filament, they are not immediately captured by the grid having a positive potential, but they pass through the grid, are pulled back by the Coulomb force to the grid, then overstep gain through the grid, and so on. Namely, the negatively charged electrons repeat their oscillatory motions around the grid with decreasing magnitude and are eventually absorbed by the grid. Thus substantially they do not reach the substrate which is, therefore, not subjected to electron shocks and not heated to a higher temperature. This is why a material having poor thermal resistance such as organic plastic may be used as a substrate. As organic plastics, polypropylene, ABS resin, polyethylene terephthalate, polymethylmethacrylate, CS-23, etc. are the examples which gave satisfactory results. Among these, polyethylene terephthalate is preferred because of the superior tensile strength and of the availability in the form of film with various thickness.

The thin-film forming substance is necessarily in a gaseous state when it comes into the vacuum chamber through the gas introducing device. In contrast with the prior art where the material to be deposited (say, aluminum) is brought into the system as a solid and then heated within the chamber to evaporate or to sublimate, a much wider selection of the material to be deposited is available in accordance with the present invention.

An embodiment of the present invention will now be illustrated with reference to the accompanying drawings. This is solely for the purpose of the explanation, not of any restrictive sense.

In FIG. 1, a base plate 2 and a bell jar 3 are constructed as a unit via a packing 4 to form a vacuum chamber 1. Electrodes 5, 6, 7 and 8, each of which may also act as a support, pass through the base plate 2. Clearances which arise between these electrodes and the base plate 2 are sealed in an airtight manner. These electrodes 5, 6, 7 and 8 are electrically insulated from the base plate 2 which has a hole 2A at the center thereof. The hole 2A communicates with an evacuating system (not shown).

Figure 2:
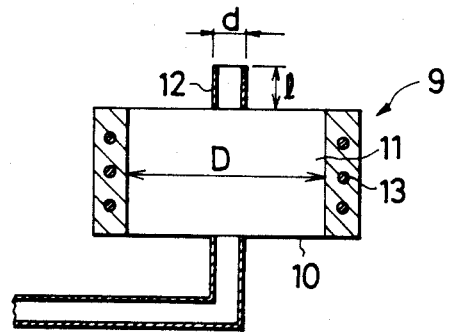
FIG. 2 is a schematic vertical longitudinal sectional view showing a gas introducing device incorporated into the vapor deposition apparatus shown in FIG. 1.

As shown in FIG. 2, the gas introducing device 9 comprises a reactor portion 10 having a reaction space 11 for bringing the gaseous raw material into reaction, a nozzle 12 which opens at a top end thereof into the vacuum chamber 1, and heating means 13 disposed in a side wall portion of the reactor portion 10 so as to heat the gaseous raw material supplied into the reaction space 11. The gas introducing device 9 is made of a material such as stainless steel, tungsten and molybdenum. The heating means 13 is made of nichrome wire or tungsten wire and adapted to heat the gaseous raw material up to 600° C. to 800° C. The gas introducing device 9 is connected to a terminal negative in potential (to ground in FIG. 1) relative to a grid 14. A lower end of the gas introducing device 9 is connected through the pipe electrode 5 with a pressure reducing valve 15, a gas mixer 16, valves 17, 18 and bombs 19, 20 which contain the gaseous raw material.

The gaseous raw material supplied into the reaction space 11 is heated by the heating means 13 to thereby produce the gaseous thin-film forming substance. The heating means 13 is controlled in such a manner that the gaseous raw material is heated to a temperature at which the gaseous raw material (e.g. $SiH_4$ or $SiH_4 + O_2$) is changed into the gaseous thin-film forming substance (e.g. Si or $SiO_2$) through a reaction thereof.

The gaseous thin-film forming substance is changed into a state of a cluster owing to a differential pressure between a pressure in the reaction space 11 and a pressure in the vacuum chamber 1 when the gaseous thin-film forming substance is blown out into the vacuum chamber 1.

The nozzle 12 is formed in such a manner that it has an inner diameter smaller than that of the reactor portion 10. The ratio of the inner diameter d of the nozzle 12 to the inner diameter D of the reactor portion 10 is properly selected so that the cluster formation of the gaseous thin-film forming substance is sufficiently performed. The cluster formation greatly contributes to a formation of very dense thin-film on a substrate 21. The ratio of the inner diameter d of the nozzle 12 to a length l of the nozzle 12 is generally determined in a range of ⅓ to 1/5. If the ratio of d/l is less than ⅓, there can not be obtained the differential pressure sufficient for the cluster formation mentioned above. On the other hand, if the ratio of d/l is larger than 1/5, the gaseous thin-film forming substance can not cover the whole surface of the substrate 21 when the gaseous thin-film forming substance reaches a surface of the substrate 21. As a result, homogeneous thin-film can not be formed.

Furthermore, the gaseous raw material fed from the gas mixer 16 is generally reduced in the pressure thereof to a range of 0.3 to 1.5 kg/cm$^2$.

A filament 22, which is made, for example, of tungsten and emits thermoelectrons, is supported between a pair of the electrodes 6. The filament 22 has a shape suitable to cover diffused gaseous thin-film forming substance from the gas introducing device 9 by assembling a plurality of filaments in a parallel manner or in a net manner. The electrode 7 supports the grid 14 of the form which allows the gaseous thin-film forming substance to pass therethrough. In this embodiment, it takes the form of a net. A support 23 supports a counter electrode 24 which in turn holds a substrate 21 on its lower surface. If this state is viewed upward, the counter electrode 24 is behind the substrate 21.

The electrodes 5, 6, 7 and 8 are electrically conductive whose end portions extend outside the vacuum chamber 1 and ar connected with various power sources. In the illustrated embodiment, the electrode 7 is connected with the positive terminal of a direct current voltage source 26, the electrode 5 to the negative terminal of the direct current voltage source, and the pair electrodes 6 to a thermoelectron generating power source 27. The electrode 8 is connected with the negative terminal of an optional direct current voltage source 28. The voltage at the source 26 must be larger than the one at 28, of course. The grounding shown is not necessarily required.

Actually, these electric connections conveniently include various switches which are operated to perform the vapor deposition process, but such switches are not shown.

The formation of a thin film using the vapor deposition apparatus according to the present invention will now be described.

After the substrate 21 is set as shown, the vacuum chamber is maintained in advance at a reduced pressure of $10^{-5}$–$10^{-6}$ Torr. An active or inert gas or a mixture of both is introduced into the vacuum chamber 1 at a pressure of $10^{-2}$–$10^{-4}$ Torr, from bombs 29, 30, via valves 31, 32. In this embodiment, for the convenience of explanation, it is assumed that the valve 31 is closed so that argon alone is introduced.

The power sources are turned on to apply a positive potential to the grid 14 and a negative one to the counter electrode 24. An electric current starts to flow through the filament 22. Out of the gaseous (argon) molecules introduced into the vacuum chamber 1, upon collision with the thermoelectrons emitted from the filament 22, their outer-shell electrons are punched out to thereby ionize the argon atoms into positive ions.

On the other hand, the gaseous raw material supplied into the gas introducing device 9 through the pipe 5 is heated in the reaction space 11 of the reactor portion 10 up to a temperature of forming the gaseous thin-film forming substance. Then, the thus formed gaseous thin-film forming substance is blown out into the vacuum chamber 1 through the nozzle 12. At the time when the gaseous thin-film forming substance passes through the nozzle 12, the gaseous thin-film forming substance is changed into the cluster state.

When a substantial part of the introduced gaseous thin-film forming substance is ionized into positive ions upon contact with the thermoelectrons and/or with the ionized argon atoms, the remaining thermoelectrons oscillate up and down around the grid 14, as described above. During the process, ionization of the gaseous thin-film forming substance molecules is further expedited by the impingement with the thermoelectrons and/or ionized argon.

Unionized portion of the gaseous thin-film forming substance having passed through the grid 14 may still further be ionized into positive ions between the grid 14 and the substrate 21 by impingement with the ionized argon to enhance the ionization degree.

In this way, the gaseous thin-film forming substance ionized into positive ions is accelerated toward the substrate 21 by the action of the electric field directed from the grid 14 to the counter electrode 24. It impinges on the substrate 21 with high energy and deposits thereon. This causes a thin film having very high adhesiveness to the substrate.

In addition to this, the gaseous thin-film forming gas introduced into the vacuum chamber 1 is in the state of cluster, which enables the formation of highly dense thin-film.

Finally, though most thermoelectrons are absorbed by the grid 14, the remainder, if any, passes through the grid 14, but the speed is reduced between the grid 14 and the substrate 21 due to the action of the electric field. Therefore, even if some thermoelectrons reach the substrate 21, they will not heat the substrate 21 to a damaging level.

In the present invention, the ionization degree of the gaseous thin-film forming substance is believed very high, so that a thin film having desired physical properties is readily available, either with active gas alone or together with inert gas. For example, if argon, as the inert gas, and oxygen, as the active gas, are introduced, the pressure adjusted to $10^{-4}$ Torr, and SiH$_4$, as the gaseous thin-film forming substance, is selected, a thin film of SiO$_2$ forms on the substrate.

The gaseous raw material naturally depends on the required composition of thin film. For example, if a thin silicon film is desirous, SiH$_4$ or SiCl$_4$+2H$_2$ may be used as the gaseous raw material. If a thin film of SiO$_2$ is desirous, SiH$_4$+O$_2$ may be effective as the gaseous raw material. If a thin carbon film is desirous, most organic substances may be used: alcohols, benzenes, or organic gases like methane. If a thin metallic film is desirous, metal halides (copper tetrachloride, for thin copper film; aluminum trichloride, for thin aluminum film) or metal salts (triisopropyl aluminum, for thin aluminum film; Ni(CO)$_4$, for nickel) may be used as the gaseous raw material. If a thin film of an alloy is desirous, a mixed gas of chlorides of the respective component metals may be used. When a film of gallium arsenic is desirous, a mixed gas of Ga(CH$_3$)$_3$+AsH$_3$ may be used. Gases including components or compounds other than those illustrated here may be used to form a thin film.

As a preferred embodiment of the present invention, a high-frequency (13.56 MHz, 50 W–2 KW, for example) electromagnetic field may be applied between the grid 14 and the counter electrode 24. The ionization is further expedited by this high frequency electromagnetic field to thereby boost the aforementioned various effects.

Many widely different embodiments of the present invention may be constructed without departing from the spirit and scope of the present invention. It should be understood that the present invention is not limited to the specific embodiments described in the specification, except as defined in the appended claims.

What is claimed is:

1. A vapor deposition apparatus comprising:
   a vacuum chamber for receiving an active gas, an inert gas or a mixture of said active gas and said inert gas;
   a reactor disposed within said vacuum chamber for receiving a gaseous raw material;
   a heating means attached to said reactor for heating said received gaseous raw material up to a temperature of producing a gaseous thin-film forming substance;
   a nozzle attached to an upper end of said reactor, and having a cross sectional area smaller than that of an interior space of said reactor for blowing out said produced gaseous thin-film forming substance into said vacuum chamber, said cross sectional area of said nozzle being determined in such a manner as to bring about a pressure difference between said interior space and said vacuum chamber, which pressure difference makes said blown-out gaseous thin-film forming substance a state of cluster;
   a counter electrode situated in said vacuum chamber, holding a substrate oppositely to said reactor, and maintained at an electric potential equal or negative to that of said reactor and said nozzle;
   a grid in the form of a net placed between said reactor and said counter electrode, and having openings large enough to pass said gaseous thin-film forming substance;
   an electric source means electrically connected to both said counter electrode and said reactor for maintaining said grid at an electric potential positive to those of both said counter electrode and said reactor; and
   a filament placed in said vacuum chamber at a position between said reactor and said grid for emitting thermoelectrons necessary to ionize said gaseous thin-film forming substance and said active gas, said inert gas or said mixture.

2. A vapor deposition apparatus according to claim 1, in which said gaseous raw material is silane, tetrachlorosilane plus hydrogen, silane plus oxygen, a metal halide, triisopropyl aluminium, nickel carbonyl or trimethyl gallium plus arsine.

3. A vapor deposition apparatus according to claim 1, in which said substrate is made of a material with poor thermal stability.

4. A vapor deposition apparatus according to claim 3, in which said material is an organic plastic.

5. A vapor deposition apparatus according to claim 1, in which a high frequency electromagnetic field is applied between said grid and said counter electrode.

* * * * *

UNITED STATES PATENT AND TRADEMARK OFFICE
CERTIFICATE OF CORRECTION

PATENT NO. : 4,974,544

DATED : DECEMBER 04, 1990

INVENTOR(S) : WASABURO OHTA

It is certified that error appears in the above-identified patent and that said Letters Patent is hereby corrected as shown below:

Title Page, paragraph [73] should read as --Assignee: Ricoh Company, Ltd., Tokyo, Japan Signed and Sealed this Twentieth Day of October, 1992

Attest:

DOUGLAS B. COMER

*Attesting Officer*  *Acting Commissioner of Patents and Trademarks*